US005835826A

United States Patent [19]

Okada et al.

[11] Patent Number: 5,835,826

[45] Date of Patent: Nov. 10, 1998

[54] IMAGE FORMING APPARATUS AND IMAGE FORMING METHOD

[75] Inventors: Tomoaki Okada; Toyofumi Shimada; Hiroaki Ikeda, all of Hiroshima; Hiroyoshi Kawamura, Mihara, all of Japan

[73] Assignee: Mitsubishi Heavy Industries, Ltd., Tokyo, Japan

[21] Appl. No.: 810,290

[22] Filed: Mar. 3, 1997

[30] Foreign Application Priority Data

Mar. 13, 1996 [JP] Japan .................................... 8-056419

[51] Int. Cl.$^6$ ............................. G03F 15/11; G03F 15/16

[52] U.S. Cl. .......................... 399/249; 399/237; 399/296; 430/117; 430/126

[58] Field of Search ................................ 399/296, 57, 66, 399/237, 241, 249, 234, 235, 310, 311, 314; 430/117, 126, 937

[56] References Cited

U.S. PATENT DOCUMENTS

| | | | |
|---|---|---|---|
| 3,994,725 | 11/1976 | Volkers | 430/126 |
| 4,168,119 | 9/1979 | Nishimura et al. | 399/249 |
| 4,218,246 | 8/1980 | Tanaka et al. | 430/126 |
| 4,736,227 | 4/1988 | Till et al. | 399/296 |
| 5,424,813 | 6/1995 | Schlueter, Jr. | 399/239 |
| 5,666,616 | 9/1997 | Yoshino et al. | 399/237 X |

FOREIGN PATENT DOCUMENTS

| | | |
|---|---|---|
| 19539346 | 4/1996 | Germany . |
| 6-282175 | 10/1994 | Japan . |
| 8-030113 | 2/1996 | Japan . |

OTHER PUBLICATIONS

Patent Abstracts of Japan, Shimoyama Makoto and Ozaki Ikuo, "Electrophotographic Printing Machine", Mar. 9, 1992, 1 page.

*Primary Examiner*—Arthur T. Grimley
*Assistant Examiner*—Sophia S. Chen
*Attorney, Agent, or Firm*—Wenderoth, Lind & Ponack, L.L.P.

[57] ABSTRACT

An image forming apparatus and method in which the flow of a toner image formed on an image carrier is prevented at the time of removing a surplus liquid developer and at the time of transfer of the image onto a transfer material. The apparatus includes an image carrier, a device for forming an electrostatic latent image on a surface of the image carrier, and a developing section for supplying a liquid developer onto the electrostatic latent image so as to form a toner image. The apparatus also includes a device for removing a surplus liquid developer remaining on the surface of the image carrier after the toner image is formed. A transfer device transfers the toner image onto a surface of a transfer material. An electric charge giving device, which is disposed between the developing section and the device for removing the surplus liquid developer, applies an electric charge to the toner image in a same polarity as that of the toner image.

18 Claims, 10 Drawing Sheets

IMAGE FORMING APPARATUS AND IMAGE FORMING METHOD

BACKGROUND OF THE INVENTION

1. Field of the Invention

The present invention relates to an on-demand type image forming apparatus and image forming method.

2. Description of the Prior Art

As for an on-demand type image forming apparatus for recording an image on a transfer material by an electrophotographic method using a liquid developer, a construction shown in FIG. 12 has been generally employed so far. In FIG. 12, numeral 11 designates an image carrier which is a photosensitive drum and is rotated to the direction shown by an arrow. Along said rotational direction around the image carrier 11, there are disposed an electrical charging device 12, a light exposing device 13, a developing device 14, a squeezing device 15, a transfer device 16, a cleaning blade 17 and an elimination device 18. The electrical charging device 12 is connected to an electric source which is not shown in the figure. The transfer device 16 using a corona type electrical charger is connected to an electric source DC.

While the image carrier 11 rotates, a surface (photosensitive surface) of the image carrier 11 is charged, in (+) for example, by the electrical charging device 12 and then light is exposed to the surface of the image carrier 11 by the light exposing device 13 so that an electrostatic latent image 1 is formed on said surface. Then a liquid developer 3 is applied to said surface of the image carrier 11 by the developing device 14 and a toner image 2A is formed on said surface by toner particles 2, of (+) for example, based on the electrostatic latent image 1. The liquid developer 3 is a liquid of insulating nature in which toner particles 2 charged in (+) or (−) are dispersed. In the figure, the toner particles 2 are charged in (+). In the developing device 14, the liquid developer 3 is fed onto the electrostatic latent image 1 of the image carrier 11 and development is so made that the toner particles 2 of (+) dispersed in the liquid developer 3 are moved electrophoretically to the electrostatic latent image 1.

After the development is so made, a surplus liquid of insulating nature in the liquid developer 3 remaining on the image carrier 11 is removed by the squeezing device 15, and at a contacting position of the image carrier 11 and a transfer material 4 carried from a carrying roller 19, an electric charge is given from a back side of the transfer material 4 by the transfer device 16 in a reverse polarity, (−) for example, of the toner particles 2 of the toner image 2A. Thus, the toner particles 2 forming the toner image 2A of the image carrier 11 are attracted to the transfer material 4 and the toner image 2A is transferred onto the transfer material 4.

Thereafter, the toner particles 2 remaining on the surface of the image carrier 11 are removed by the cleaning blade 17 and the electric charge remaining on the surface of the image carrier 11 is eliminated by the elimination device 18.

In such an image forming apparatus as described above, after the squeezing (removing of the surplus liquid developer) or at the time of the transfer, there may occur a case where the toner forming the toner image moves and the toner image flows, which is especially remarkable in the case of making the image density higher or at the time of making an overlapped printing.

That is, as shown in FIG. 8, the toner image 2A, after developed, on the surface of the image carrier 11 is in a state that a lot of toner particles 2 are bound and gathered by the electric field caused by the electric charge existing on a non-picture and line portion where not toner image is formed and the cohesive force between the toner particles 2 is weak. The toner particles 2 of an edge portion of the toner image 2A existing near the non-picture and line portion are bound to be pressed and held by the edge effect of the electric field caused by the electric charge of the non-picture and line portion. But if the area of the toner image 2A is broad, such as a toner image of a solid image, the binding force by the electric field caused by the electric charge of the non-picture and line portion does not tend to act on the toner particles 2 in the central portion of the toner image 2A and the toner particles 2 are liable to move.

For this reason, in case of the squeezing where a force to remove the surplus liquid on the surface of the image carrier 11 is added to the liquid developer 3 by the squeezing device 15 or in case of the transfer where a nip pressure added to the toner particles 2 by the transfer device 16 is increased, there may be a case where the toner particles 2 in the central portion of the toner image 2A move and the toner image 2A flows.

In such case, if the image density of the toner image 2A is increased, a phenomenon that the toner image 2A flows at the time of removing the surplus liquid developer becomes remarkable. That is, if the image density of the toner image 2A is increased, it means that a quantity of solid content in the toner image 2A to be transferred onto the surface of the transfer material 4 is increased, which in turn means that a quantity of the toner adhering to the surface of the image carrier by the development is increased and the toner layer is made thicker.

The matter that the toner image flows after the squeezing, if the image density of the toner image is increased, will be understood from FIG. 9.

As shown in FIG. 9(*a*), before the image density is increased, the toner particles in the surface layer of the toner image 2A formed on the surface of the image carrier 11 do not flow at the time of the squeezing by the squeezing device 15. But, as shown in FIG. 9(*b*), if the image density is increased, the toner particles 2 in the surface layer of the toner image 2A formed on the surface of the image carrier 11 tend to flow at the time of removing the surplus liquid developer. Thereby, as shown in FIG. 9(*c*), a line-like irregularity may occur in the toner image 2A which is a solid picture after the squeezing. This is liable to grow conspicuous as the quantity of the toner is increased and the image density of the toner image is made higher.

Further, the matter that the toner image flows also in case the toner image is formed overlappedly is described.

FIG. 10 shows steps in which the toner image is formed overlappedly. In the figure, letter A designates an image recording device of a first step and letter B designates an image recording device of a second step. In the respective device A and B, same portions as those shown in FIG. 12 are denoted with same numerals. In the device A, the toner image 2A is formed on the transfer material 4, then in the device B (without fixing the respective color) a toner image 2B in a separate color is printed overlappedly on the previous toner image 2A.

And the matter that the toner image flows at the time of overlapped printing means that there occurs a line-like irregularity in the toner image 2B printed at the latter step or a flow-out of the toner particles 2 beyond a frame of the toner image 2B, as shown in FIG. 11(*b*).

The cause thereof is described. As there is the previous toner image 2A on the transfer material 4, ability of the transfer material 4 to absorb a solvent is lowered. As shown in FIG. 11(*a*), when the toner image 2B is printed overlappedly on the toner image 2A of the transfer material 4, pressure acts on the toner image 2B of the image carrier 11, but as the liquid of the liquid developer is hardly absorbed, there occurs a liquid flow to the backward direction of the toner image. Due to this liquid flow, floating toner particles (toner particles of weak adhering force) 2 flow out to the backward direction of the toner image.

As a countermeasure for such problems, there is disclosed a method in which fiber-like projections are provided on toner particles, thereby cohesion force between the toner particles at the time of image forming is strengthened so that an image flow at the time of transfer is suppressed (Japanese published patent Hei 5-87825). But the toner used for said method is so special that it is not applicable as a toner used for a usual image forming.

Further, there is disclosed an apparatus using a transfer device 16A as shown in FIG. 13 in which a transfer device 16 and an electrical charger 161 which is an electric charge giving portion are aligned in the toner image moving direction (Japanese published patent Sho 63-305375). The transfer device 16 gives an electric charge in a reverse polarity as that of the toner particles of a toner image 2A from a back side of a transfer material 4. The electrical charger 161 which is the electric charge giving portion gives an electric charge in a same polarity as that of the toner particles 2 of the toner image 2A from the back side of the transfer material so that the toner image is formed pressedly on a photosensitive surface of the image carrier 11 by the repulsive force between the toner particles 2 and the electric charge, thereby irregularity of the image occurring at the time of contact of the transfer material 4 and the toner image 2 is suppressed. The electrical charger 16 is a corona type charger. The transfer device 16 is connected to an electric source DC.

In said apparatus, however, an image flow at the time of removing the surplus liquid developer cannot be avoided. Further, at the time of overlapped printing, if an electric charge of same polarity as the toner particles 2 is given for preventing irregularity of the toner image 2B on the surface of the image carrier 11, adhering force to the transfer material 4 of the toner image 2A of the previous step is weakened and an image flow occurs. For this reason, at the time of overlapped printing, a sufficient electric charge of same polarity as the toner particles 2 cannot be given, hence an effect of preventing flow of the toner image cannot be obtained sufficiently.

SUMMARY OF THE INVENTION

It is an object of the present invention to provide an image forming apparatus and an image forming method by which flow of a toner image formed on an image carrier is prevented at the time of removing a surplus liquid developer and at the time of transfer, especially flow of the toner image when a dense toner image is formed and when an overlapped printing is made is prevented securely, so that a toner image of high density and high quality can be formed.

An image forming apparatus according to claim 1 of the present invention comprises an image carrier, a means for forming an electrostatic latent image on a surface of said image carrier, a developing means for supplying a liquid developer onto said electrostatic latent image to form a toner image, a means for removing a surplus liquid developer remaining on the surface of said image carrier after said toner image is formed, a transfer means for transferring said toner image formed on the surface of said image carrier onto a surface of a transfer material and an electric charge giving means disposed between said developing means and said means for removing the surplus liquid developer for giving an electric charge to said toner image in a same polarity as that of said toner image.

According to the construction of said invention, the electric charge giving means disposed between the developing means and the surplus liquid developer removing means gives an electric charge directly to the toner image formed on the surface of the image carrier in a same polarity as that of said toner image, thereby the toner image is pressed onto the surface of the image carrier to form a state where the toner particles contact each other densely. Hence, there occurs no flow of the toner image when the step to remove the surplus liquid of the liquid developer on the image carrier, after the development, is taken place.

Accordingly, the toner image formed on the image carrier is prevented from flowing when the surplus liquid developer is removed, especially the toner image when a dense toner image is formed and when an overlapped printing is made is prevented securely from flowing, and a toner image of high density and high quality can be formed.

An image forming apparatus according to claim 2 of the present invention comprises, in addition to the image forming apparatus according to claim 1, an electric charge giving means disposed between said surplus liquid developer removing means and said transfer means for giving an electric charge to said toner image in a same polarity as that of said toner image.

According to the construction of said invention, in addition to the function mentioned for claim 1, the additional electric charge giving means disposed between the surplus liquid developer removing means and the transfer means gives an electric charge directly to the toner image of the image carrier passing the surplus liquid developer removing means in a same polarity as that of said toner image, thereby the toner image is pressed onto the surface of the image carrier to form a state where the toner particles contact each other densely. Hence, the toner image can be prevented from flowing when the toner image and the transfer material make contact with each other at the time of transfer.

According to the invention of claim 3, in the image forming apparatus according to claim 1 or 2, said transfer means comprises two electric charge giving portions aligned along the toner image moving direction, one positioned upstream in the toner image moving direction being for giving an electric charge to said toner image in a same polarity as that of said toner image and the other positioned downstream in the toner image moving direction being for giving an electric charge from a back side of said transfer material in a reverse polarity of that of said toner image so that said toner image is transferred onto said transfer material.

According to the construction of said invention, in addition to the function mentioned for claim 1 or 2, an electric charge of a same polarity as that of the toner particles of the toner image of the image carrier is given, thereby the toner particles are pressed onto the photo-sensitive surface of the image carrier by the repulsive force between the toner particles and the electric charge so that the toner image is strengthened. Thereafter, an electric charge is given to the toner particles of the toner image from the back side of the transfer material in a reverse polarity of that of the toner particles and the transfer is made onto the transfer material. Thus, the toner image is prevented from flowing by the contact of the transfer material and the toner image.

An image forming method according to claim 4 of the present invention comprises a step of forming an electrostatic latent image on a surface of an image carrier, a step of supplying a liquid developer onto said electrostatic latent image to form a toner image on the surface of said image carrier, a step of giving an electric charge to said toner image in a same polarity as that of said toner image, a step of removing a surplus liquid of said liquid developer remaining on the surface of said image carrier and a step of transferring said toner image on the surface of said image carrier onto a surface of a transfer material.

An image forming method according to claim 5 of the present invention comprises, in addition to the image forming method according to claim 4, a step of giving an electric charge once more to said toner image in a same polarity as that of said toner image between said step of removing a surplus liquid developer and said step of transfer.

According to the invention of claim 6, in the image forming method according to claim 4 or 5, said step of transfer is giving an electric charge to said toner image on the surface of said image carrier in a same polarity as that of said toner image and then giving an electric charge from a back side of said transfer material in a reverse polarity of that of said toner image so that said toner image is transferred onto said transfer material.

DESCRIPTION OF THE PREFERRED EMBODIMENTS

Figure 12:
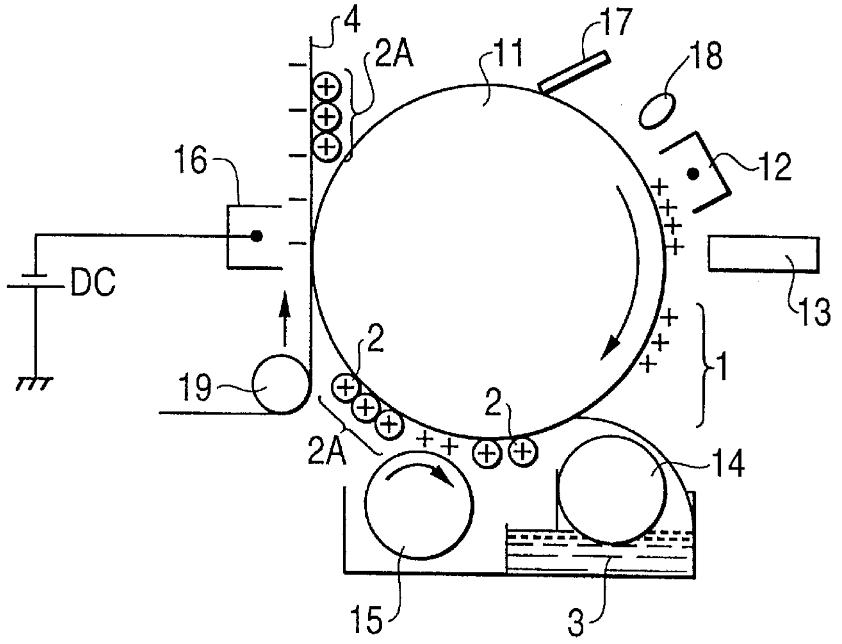
FIG. 12 (PRIOR ART)
FIG. 12 is a view showing an image forming apparatus in the prior art.
Figure 13:
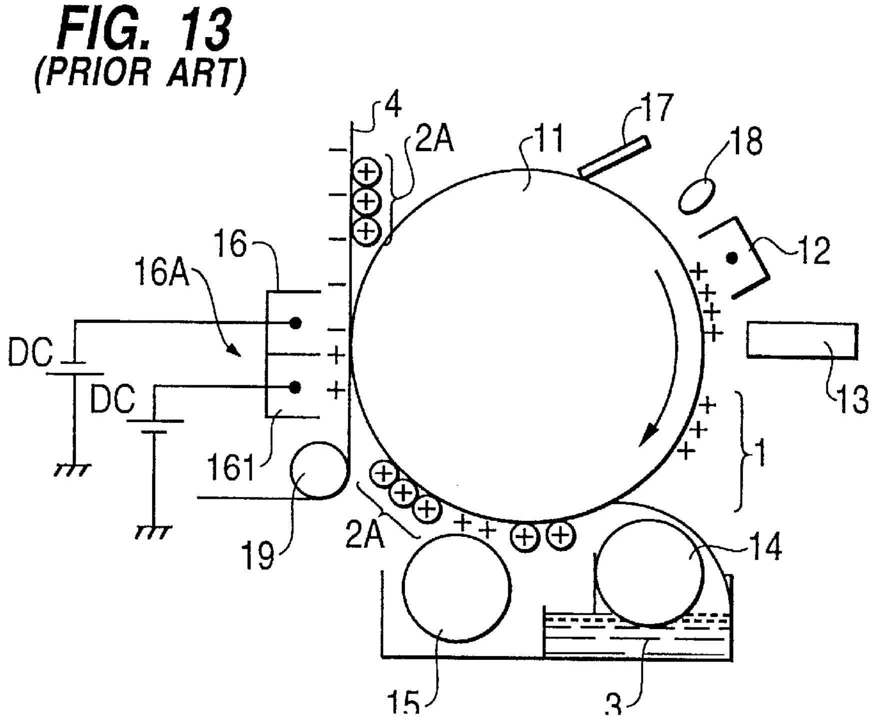
FIG. 13 (PRIOR ART)
FIG. 13 is a view showing another image forming apparatus in the prior art.

A first preferred embodiment according to the present invention is described with reference to FIGS. 1 and 2. This preferred embodiment is designed to be applied to the image forming apparatus shown in FIG. 12 and same portions in FIGS. 1 and 2 as those in FIG. 12 are denoted with same numerals.

Figure 1:
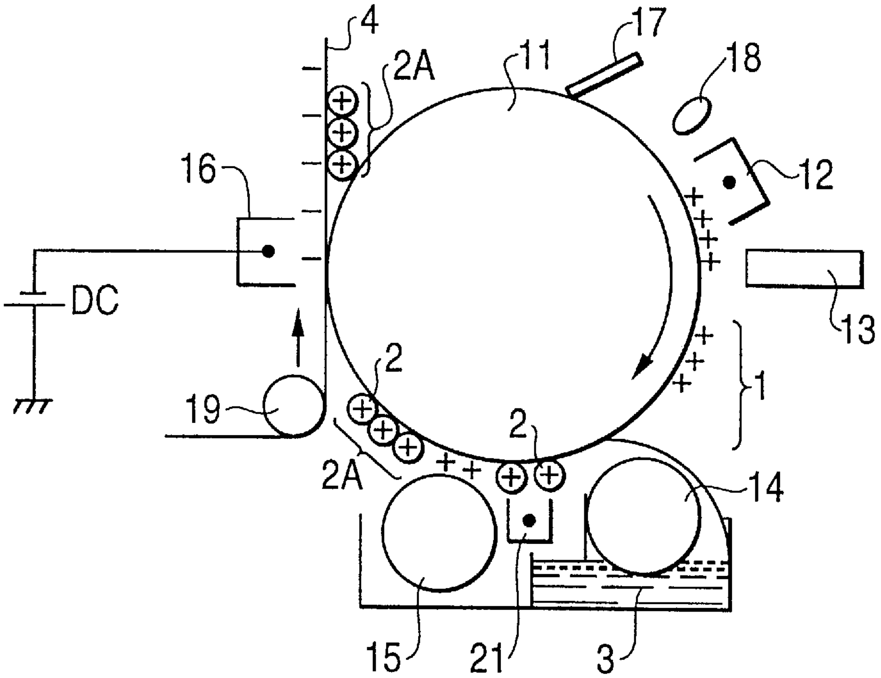
FIG. 1 is a view showing an image forming apparatus of a first preferred embodiment according to the present invention.
Figure 2:
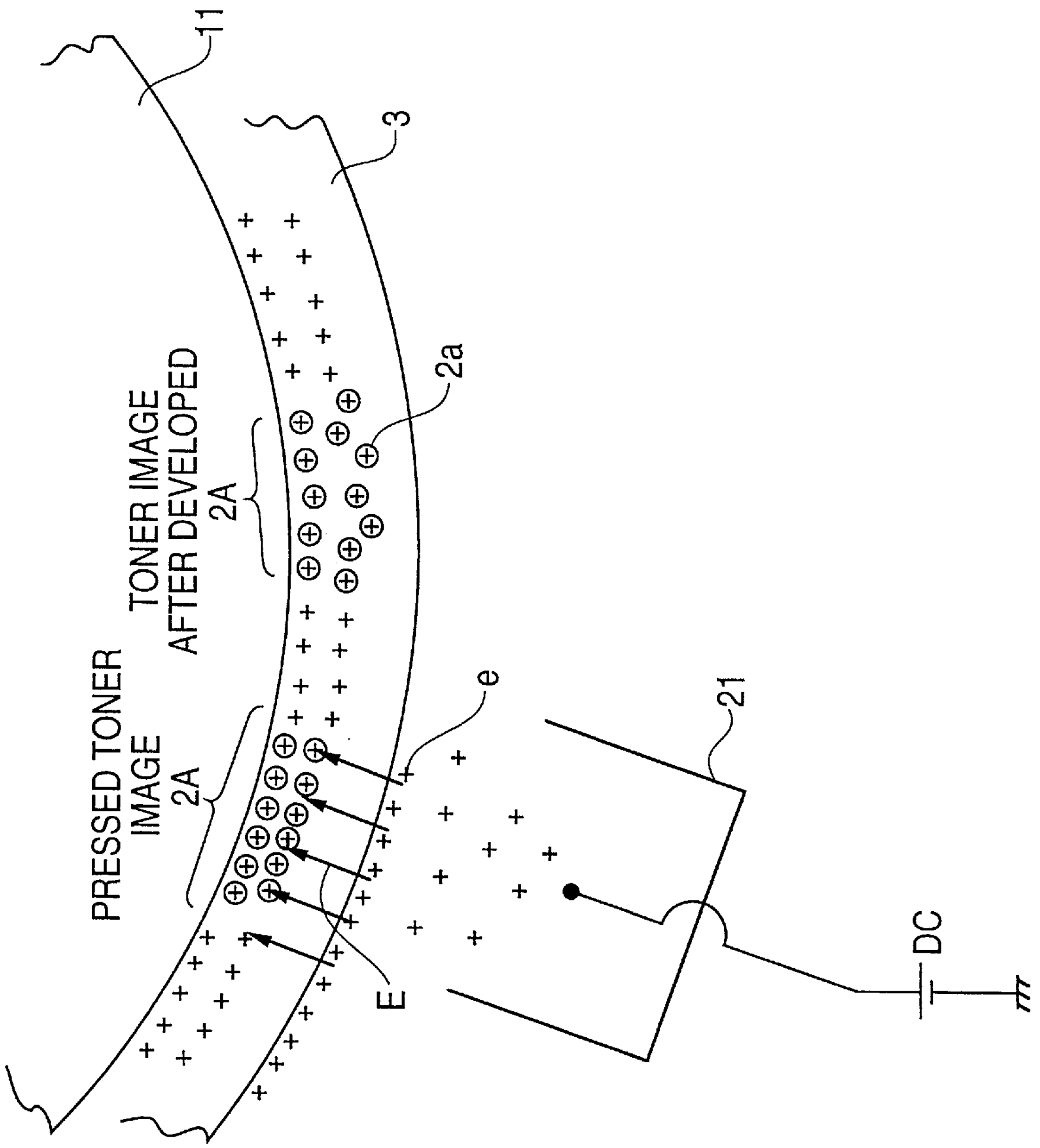
FIG. 2 is a view showing a principle of giving an electric charge to a toner image in the image forming apparatus of the first preferred embodiment.

That is, in FIG. 1, numeral 11 designates an image carrier which is rotated to the direction shown by an arrow. Along said rotational direction around the image carrier 11, there are disposed an electrical charging device 12, a light exposing device 13, a developing device 14, a squeezing device 15, a transfer device 16, a cleaning blade 17 and an elimination device 18. Numeral 1 designates an electrostatic latent image, numeral 2 designates toner particles, numeral 2A designates a toner image, numeral 3 designates a liquid developer and numeral 4 designates a transfer material.

In this preferred embodiment, there is disposed an electrical charging device 21 between the developing device 14 and the squeezing device 15. This electrical charging device 21 is one effective example of electric charge giving means for giving an electric charge directly to the toner image 2A formed on a surface of the image carrier 11 in a same polarity as that of said toner image 2A. As for the electrical charging device 21, a corona electrical charging device of a corotron type or a scorotron type is effective. The electrical charging device 21 of a corona type, as shown in FIG. 2, is connected to an electric source DC to be applied by a direct current voltage or an alternating current voltage in which direct current is overlapped, and gives an electric charge to the toner image 2A. Incidentally, as for the electrical charging device, such as using a needle electrode or a solid discharge electrode can be also employed.

In this image forming apparatus, while the image carrier 11 rotates, a surface (photosensitive surface) of the image carrier 11 is electrically charged, in (+) for example, by the electrical charging device 12 and then light is exposed to the surface of the image carrier 11 by the light exposing device 13 so that an electrostatic latent image 1 is formed on said surface. Then the liquid developer 3 is applied to the surface of the image carrier 11 by the developing device 14 and the toner image 2A is formed on said surface by the toner particles, of (+) for example, based on the electrostatic latent image 1. The liquid developer 3 is a liquid of insulating nature in which toner particles 2 electrically charged in (+) or (−) are dispersed. In the figure, the toner particles 2 are charged in (+). In the developing device 14, the liquid developer 3 is fed onto the electrostatic latent image 1 of the image carrier 11 and development is made so that the toner particles 2 of (+) dispersed in the liquid developer 3 are moved electrophoretically to the electrostatic latent image 1.

After the development, an electric charge is given directly to the toner image 2A formed on the surface of the image carrier 11 in a same polarity, (+) for example, as that of the toner particles 2 of said toner image 2A by the electrical charging device 21. Description is made in this regard with reference to FIG. 2. In the toner image 2A, after developed, cohesive force between the toner particles is weak, especially there are flowable floating toner particles 2$a$ on the surface layer of the toner image 2A. If said toner image 2A after developed is given an electric charge e of same polarity as the toner particles 2 by the electrical charging device 21, the toner particles 2 are pressed onto the surface of the image carrier 11 by an electric field formed by the electric charge on the surface of the toner image 2A and become a densely gathered state. Thus, the toner particles 2 are pressed and form a strong toner image 2A.

Then, by the squeezing device 15, a surplus liquid of insulating nature in the liquid developer 3 remaining on the image carrier 11 is removed. In this case, as the toner image 2A is formed strongly by the pressed toner particles 2, the toner particles 2 do not flow even with movement of the squeezing device 15 and the toner image 2A keeps its original form without flow of the image.

Then, the transfer material 4 is carried into contact with the image carrier 11 and an electric charge is given from a back side of the transfer material 4 in a reverse polarity, (−) for example, of that of the toner particles 2 of the toner image 2A by the transfer device 16 and the toner particles 2 forming the toner image 2A on the image carrier 11 are attracted onto the transfer material 4 so that the toner image 2A is transferred onto the transfer material 4.

Thereafter, the toner particles 2 remaining on the surface of the image carrier 11 are removed by the cleaning blade 17 and the electric charge remaining on the surface of the image carrier 11 is eliminated by the elimination device 18.

According to this preferred embodiment, the electrical charging device 21, which is an electric charge giving means, disposed between the developing device 14 and the squeezing device 15 gives an electric charge directly to the toner image 2A formed on the surface of the image carrier 11 in a same polarity as that of said toner image 2A, thereby the toner image 2A is pressed onto the surface of the image carrier 11 and the toner particles 2 become a densely gathered and strong state. Hence, at the time when the surplus liquid of the liquid developer 3 remaining on the image carrier 11 after the development is removed by the squeezing device 15, there occurs no flow of the toner image 2A.

Accordingly, in this preferred embodiment, the toner image 2A formed on the image carrier 11 is prevented from flowing at the time of squeezing, especially the toner image 2A is securely prevented from flowing at the time when the toner image 2A is made in a high density or when an overlapped printing is made on the transfer material 4, and the toner image 2A of high density and high quality can be formed.

Figure 3:
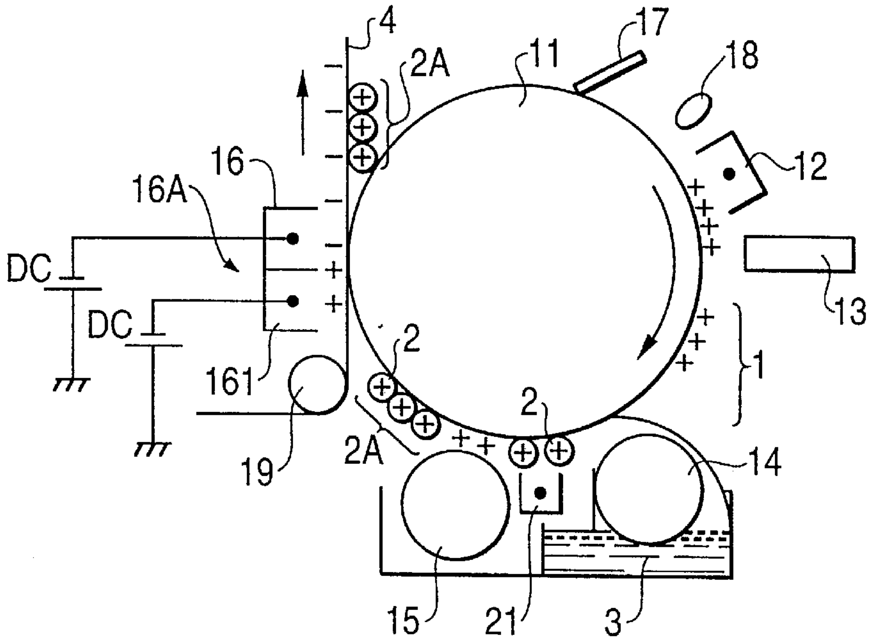
FIG. 3 is a view showing another image forming apparatus of the first preferred embodiment.

As the transfer device in this preferred embodiment, as shown in FIG. 3, a transfer device 16A in which a transfer device 16 and an electrical charger 161 as an electric charge giving portion are aligned in the toner image moving direction may be used. The conventional transfer device 16 gives an electric charge from the back side of the transfer material 4 in a reverse polarity of that of the toner particles of the toner image 2A. The electrical charger 161 as the electric charge giving portion gives an electric charge from the back side of the transfer material 4 in a same polarity as that of the toner particles 2 of the toner image 2A and the toner particles 2 are pressed onto a photosensitive surface of the image carrier 11 by the repulsive force between the toner particles 2 and the electric charge, thus irregularity of the image caused by the contact of the transfer material 4 and the toner image 2 is suppressed. The electrical charger 161 is a corona electrical charger. In this case, the toner particles of the toner image 2A in the transfer step can also be prevented from flowing.

Figure 4:
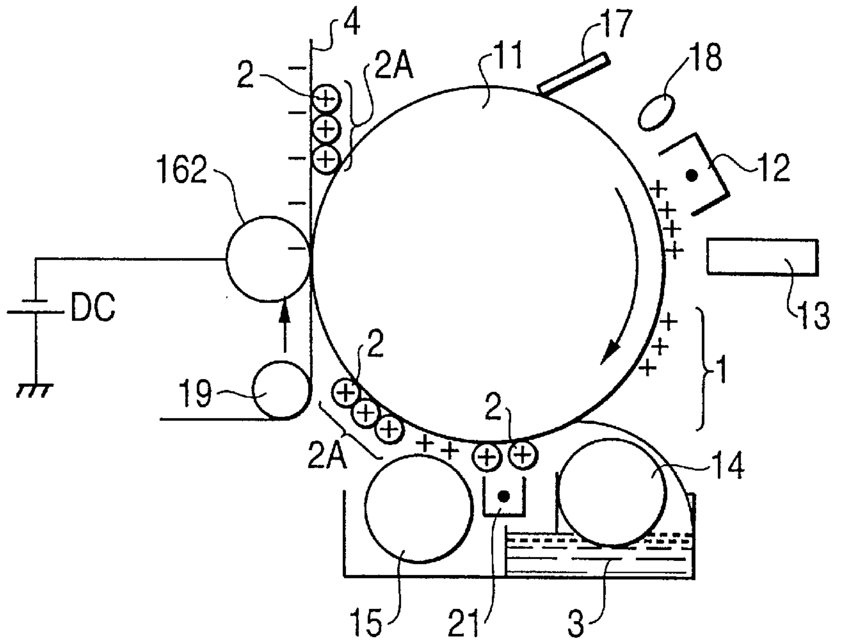
FIG. 4 is a view showing still another image forming apparatus of the first preferred embodiment.

As the transfer device in this preferred embodiment, as shown in FIG. 4, a bias roller type transfer device 162 may also be used. The bias roller of this transfer device 162 is connected to a direct current electric source DC to apply voltage to the transfer material 4 directly, and by the electric field caused thereby, the toner image 2A is transferred onto the transfer material 4.

Figure 5:
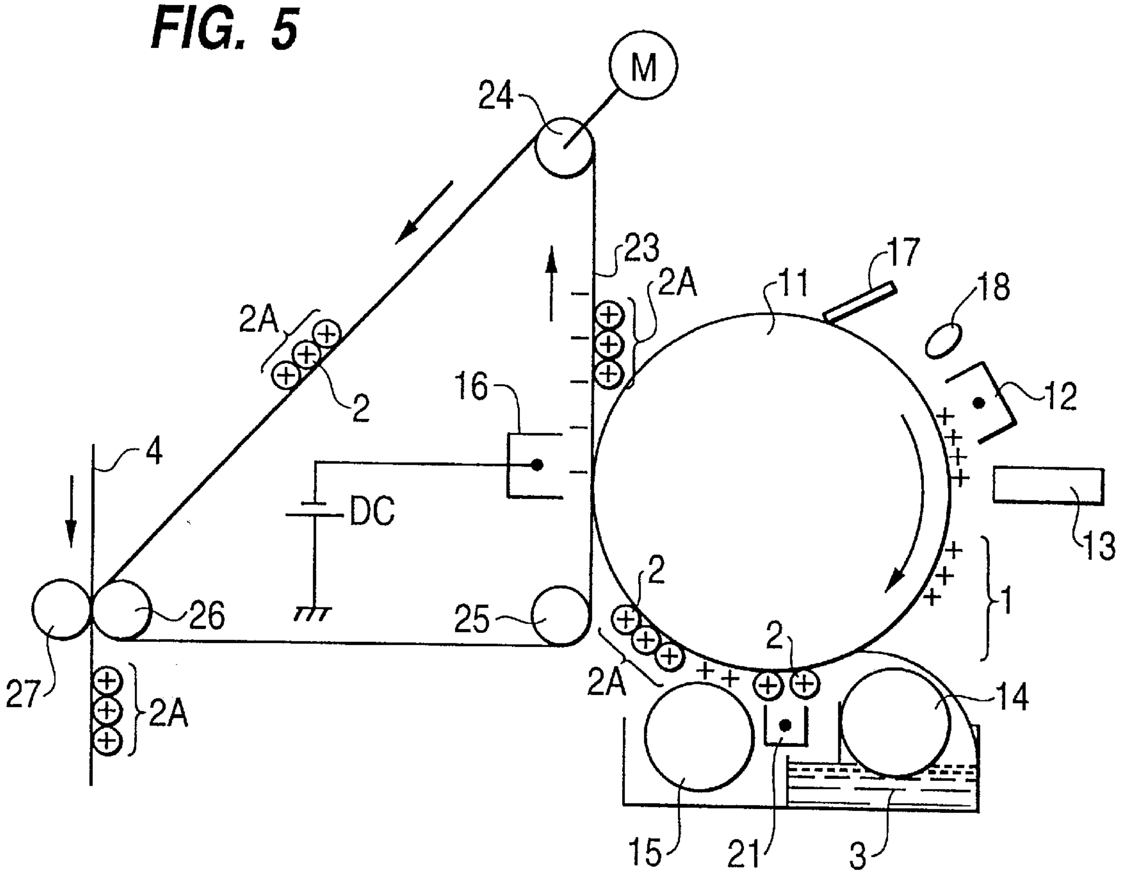
FIG. 5 is a view showing still another image forming apparatus of the first preferred embodiment.

In the transfer step, a belt-like or roller-like intermediate transfer member may also be used. FIG. 5 shows a case where a belt-like intermediate transfer member is used. An endless intermediate transfer belt 23 is supported movably around a pulley 24, which is rotationally driven by a motor M, an intermediate pulley 25 and a transfer roller 26, and this intermediate transfer belt 23 makes contact with a surface of the image carrier 11 at one portion. The transfer roller 26, in combination with a transfer roller 27, carries the transfer material 4.

That is, the pulley 24 is rotated by the motor M and the intermediate transfer belt 23 is moved in the direction shown by arrows. The intermediate transfer belt 23 makes contact with the surface of the image carrier 11, is transferred with the toner image 2A formed on said surface and is further carried between the transfer rollers 26 and 27. While the intermediate transfer belt 23 passes between the transfer rollers 26 and 27, it is overlapped on the transfer material 4 which is carried by said transfer rollers 26 and 27 so that the toner image 2A is transferred.

Figure 6:
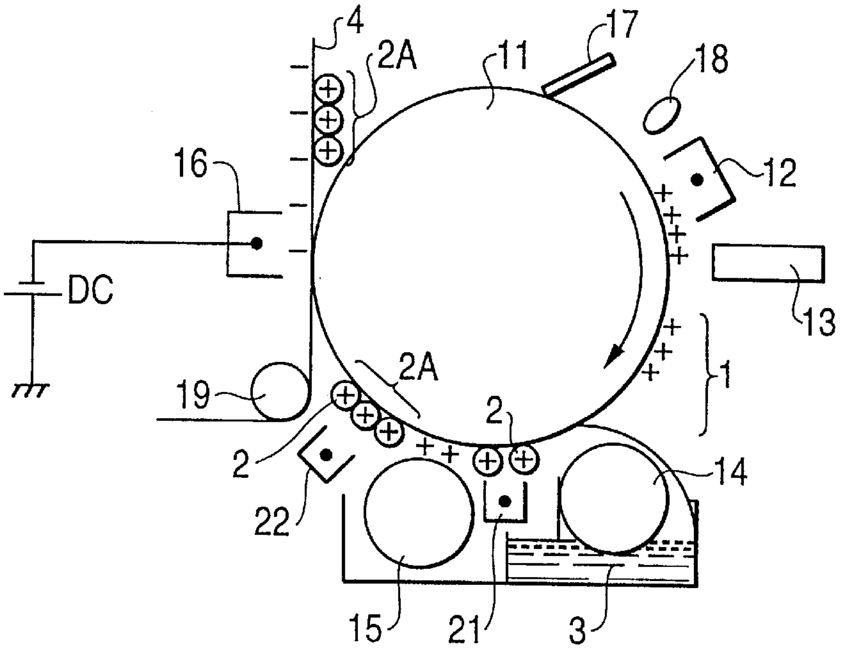
FIG. 6 is a view showing an image forming apparatus of a second preferred embodiment according to the present invention.

Next, a second preferred embodiment according to the present invention is described with reference to FIG. 6. The apparatus of FIG. 6 is designed to be applied to the image forming apparatus shown in FIG. 1 and same portions in FIG. 6 as those in FIG. 1 are denoted with same numerals. This preferred embodiment comprises, in addition to the electrical charging device 21 in the image forming apparatus of the construction shown in FIG. 1, a transfer device 22, of corona type for example, as an electric charge giving means between the squeezing device 15 and the transfer device 16. This electrical charging device 22 of corona type is one effective example of electric charge giving means for giving an electric charge directly to the toner image 2A formed on a surface of the image carrier 11 in a same polarity as that of said toner image 2A, and construction and function thereof is same as the electrical charging device 21 shown in FIG. 1.

In this image forming apparatus, while the image carrier 11 rotates, a surface (photosensitive surface) of the image carrier 11 is electrically charged, in (+) for example, by the electrical charging device 12 and then light is exposed to the surface of the image carrier 11 by a light exposing device 13 so that an electrostatic latent image 1 is formed on said surface. Then a liquid developer 3 is applied to the surface of the image carrier 11 by a developing device 14 and the toner image 2A is formed on said surface by the toner particles 2, of (+) for example, based on the electrostatic latent image 1.

After the development, an electric charge is given directly to the toner image 2A formed on the surface of the image carrier 11 in a same polarity, (+) for example, as that of the toner particles 2 of said toner image 2A by the electrical charging device 21. Thereby, the toner particles 2 of the toner image 2A are pressed onto the surface of the image carrier 11 and become a densely gathered state. Thus, the toner particles 2 are pressed and form a strong toner image 2A.

Then, by a squeezing device 15, a surplus liquid of the liquid developer 3 remaining on the surface of the image carrier 11 is removed. In this case, as the toner image 2A is formed strongly by the electrical charging device 21, the toner particles 2 do not flow and there occurs no flow of the image.

After the squeezing, an electric charge is given directly to the toner image 2A formed on the surface of the image carrier 11 in a same polarity, (+) for example, as that of the toner particles 2 of said toner image 2A by the electrical charging device 22. Thereby, the toner image 2A is pressed onto the surface of the image carrier 11 so as to be compressed. That is, before a transfer step, the toner image 2A is pressed to be compressed onto the surface of the image carrier 11. This action to press the toner image 2A onto the surface of the image carrier 11 is same as in the case of the electrical charging device 21.

Then, by the transfer device 16, the toner image 2A on the surface of the image carrier 11 is transferred onto the transfer material 4. In this case, as the toner image 2A is pressed and strengthened by the electrical charging device 22, there occurs no flow of the image.

According to this preferred embodiment, the electrical charging device 22, which is an electric charge giving means, disposed between the squeezing device 15 and the transfer device 16 gives an electric charge directly to the toner image 2A of the image carrier 11, before the toner image 2A enters the transfer step, in a same polarity as that of said toner image 2A, thereby the toner image 2A is pressed to be compressed and strengthened onto the surface of the image carrier 11. Hence, at the time of transfer wherein the toner image 2A and the transfer material 4 make contact with each other, the toner particles 2 can be prevented from flowing.

Accordingly, in addition to the effect of claim 1, the toner image 2A formed on the image carrier 11 is prevented from flowing when the surplus liquid developer is removed and when the transfer is made, especially the toner image when a dense toner image is formed and when an overlapped printing is made is prevented securely from flowing, and a toner image of high density and high quality can be formed.

Figure 7:
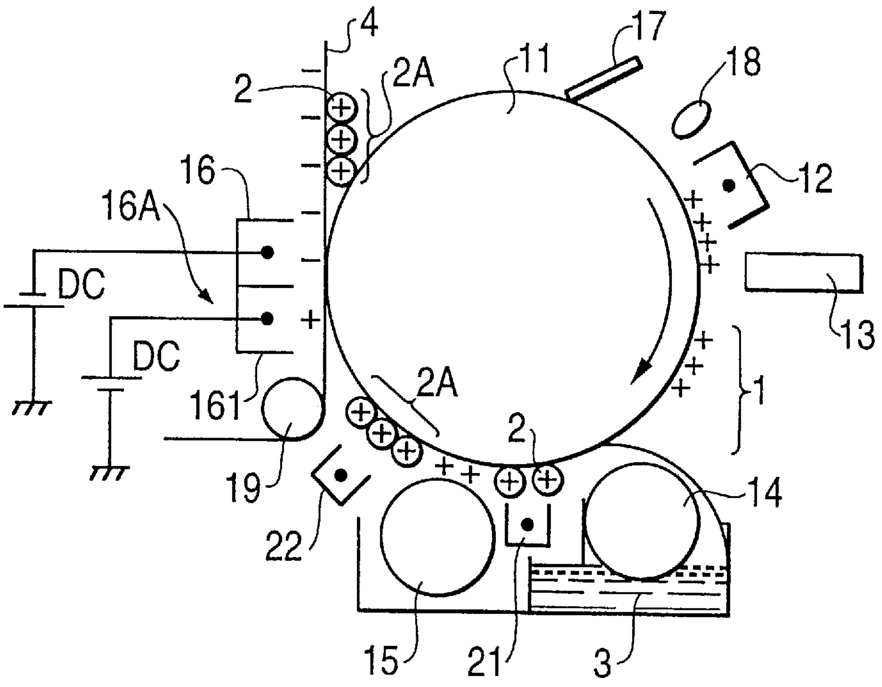
FIG. 7 is a view showing another image forming apparatus of the second preferred embodiment.
Figure 8:
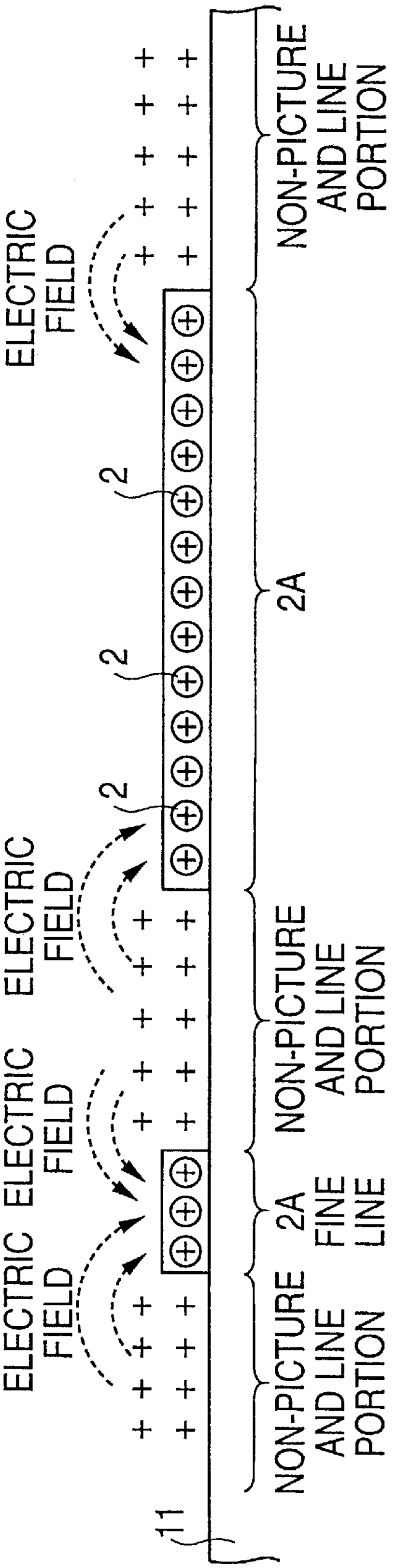
FIG. 8 is a view showing an action of an electrostatic charging device provided in an image forming apparatus.
Figure 9A:
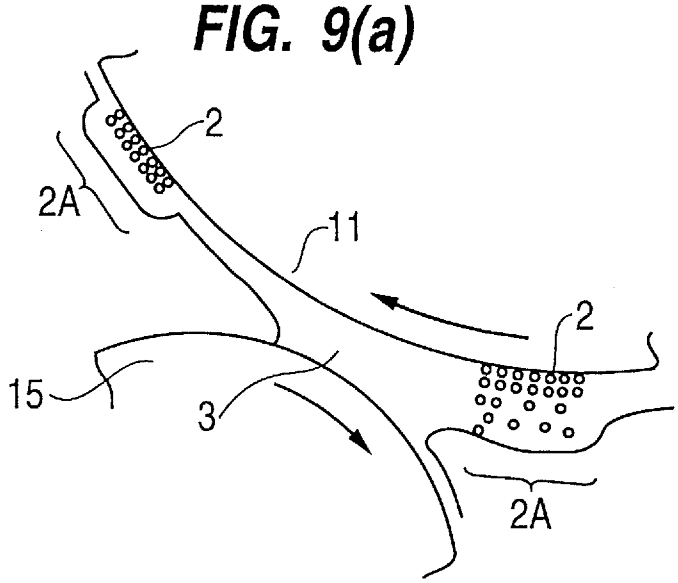
FIG. 9 is a view explaining a state of toner image in a squeezing step.
Figure 9B:
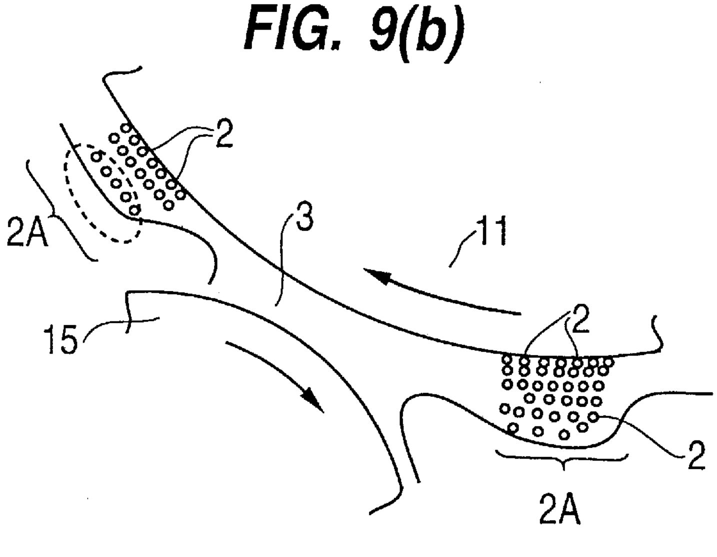
Figure 9C:
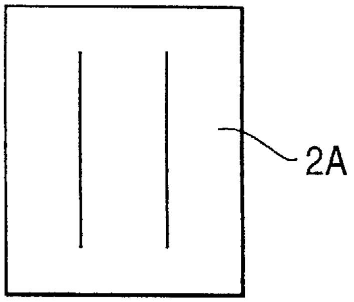
Figure 10:
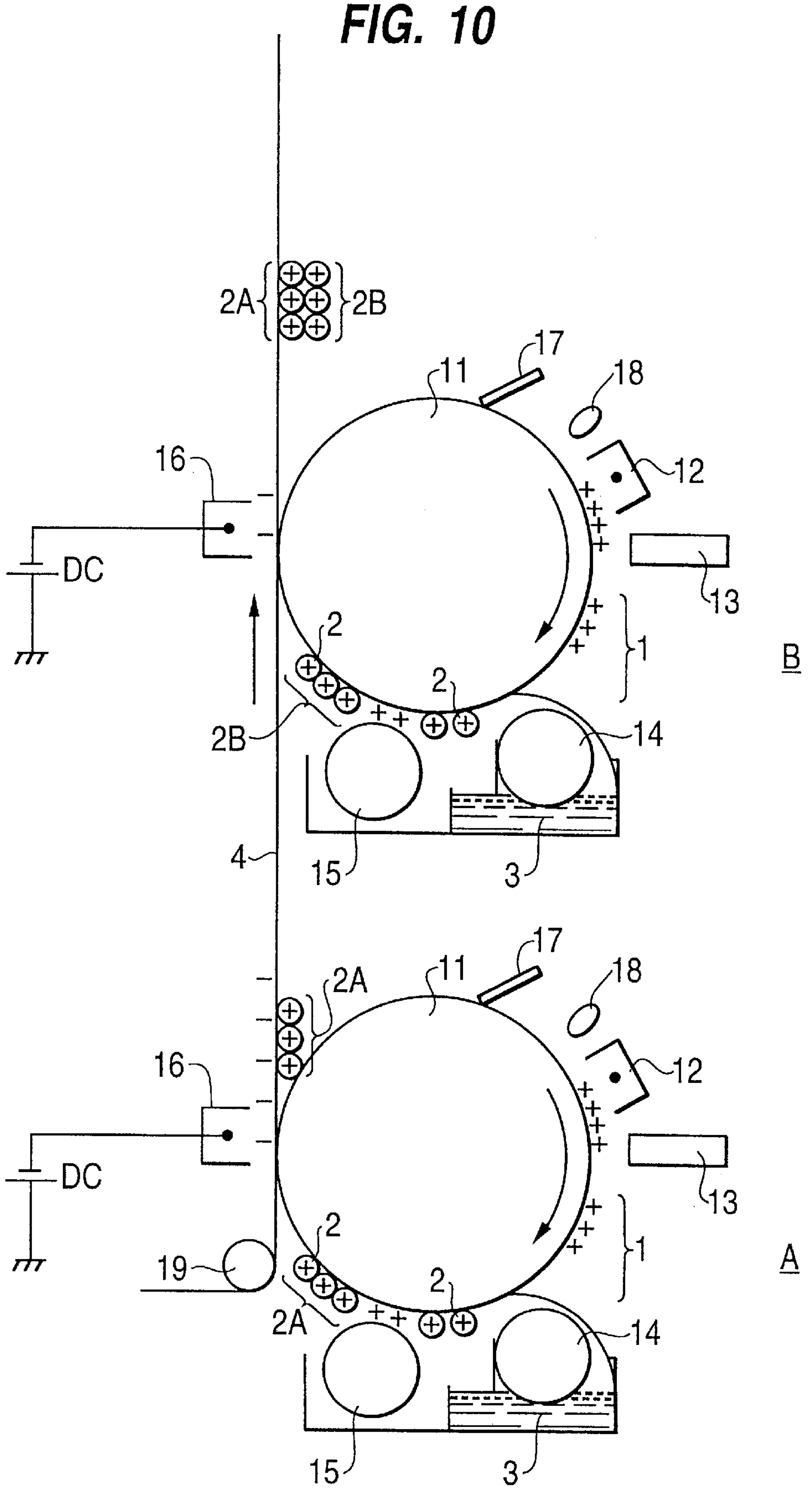
FIG. 10 is a view showing a step of overlapped printing.
Figure 11A:
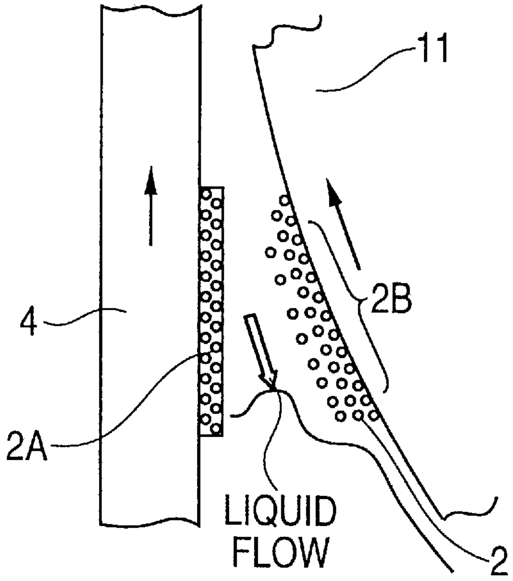
FIG. 11 is a view explaining a state of toner image in an overlapped printing.
Figure 11B:
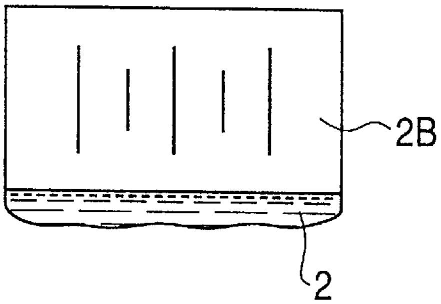

Incidentally, as the transfer device in this preferred embodiment, as shown in FIG. 7, a transfer device 16A in which an electrical charging device 161 is added to the transfer device 16 may be used, said electrical charging device 161 giving an electric charge from a back side of the transfer material 4 in a same polarity as that of the toner particles 2 of the toner image 2A so that the toner particles 2 are pressed onto the photosensitive surface of the image carrier 11 by the repulsive force between the toner particles 2 and the electric charge, thus irregularity of the image caused by the contact of the transfer material 4 and the toner image 2 is suppressed.

Further, as the transfer device, a bias roller type transfer device may be used, as well as such as using a belt-like or roller-like intermediate transfer means may be used.

Incidentally, the present invention is not limited to the preferred embodiments but may be worked with various modifications.

According to the image forming apparatus of the invention of claim 1, the electric charge giving means disposed between the developing means and the surplus liquid developer removing means gives an electric charge directly to the toner image formed on the surface of the image carrier in a same polarity as that of said toner image, thereby the toner image is pressed to be strengthened onto the surface of the image carrier. Hence, there occurs no flow of the toner image when the step to remove the surplus liquid of the liquid developer on the image carrier, after the development, is taken place.

Accordingly, the toner image formed on the image carrier is prevented from flowing when the surplus liquid developer is removed, especially the toner image when a dense toner image is formed and when an overlapped printing is made is prevented securely from flowing, and a toner image of high density and high quality can be formed.

According to the invention of claim 2, the additional electric charge giving means disposed between the surplus liquid developer removing means and the transfer means gives an electric charge directly to the toner image of the image carrier passing the surplus liquid developer removing means in a same polarity as that of said toner image, thereby the toner image is pressed to be strengthened onto the surface of the image carrier. Hence, the toner image can be prevented from flowing when the toner image and the transfer material make contact with each other at the time of transfer.

Accordingly, in addition to the effect of claim 1, the toner image formed on the image carrier is prevented from flowing when the surplus liquid developer is removed and when the transfer is made, especially the toner image when a dense toner image is formed and when an overlapped printing is made is prevented securely from flowing, and a toner image of high density and high quality can be formed.

According to the invention of claim 3, before the toner image is transferred onto the transfer material, an electric charge of a same polarity as that of the toner image is given, thereby the toner image is pressed to be strengthened onto the photosensitive surface of the image carrier by the repulsive force between the toner particles and the electric charge, and then an electric charge is given from the back side of the transfer material in a reverse polarity of that of the toner particles of the toner image so that the transfer is made onto the transfer material. Thus, in addition to the effect of claim 1 or 2, the toner image is prevented from flowing by the contact of the transfer material and the toner image.

According to the image forming method of the invention of claim 4, the toner image formed on the image carrier is prevented from flowing when the surplus liquid developer is removed, especially the toner image when a dense toner image is formed and when an overlapped printing is made is prevented securely from flowing, and a toner image of high density and high quality can be formed.

According to the invention of claim 5, in addition to the effect of claim 4, the toner image formed on the image carrier is prevented from flowing when the surplus liquid developer is removed, especially the toner image when a dense toner image is formed and when an overlapped printing is made is prevented securely from flowing, and a toner image of high density and high quality can be formed.

According to the invention of claim 6, before the toner image is transferred onto the transfer material, an electric charge of a same polarity as that of the toner image is given, thereby the toner image is pressed to be strengthened onto the photosensitive surface of the image carrier by the repulsive force between the toner particles and the electric charge, and then an electric charge is given from the back side of the transfer material in a reverse polarity of that of the toner particles of the toner image so that the transfer is made onto the transfer material. Thus, in addition to the effect of claim 4 or 5, the toner image is prevented from flowing by the contact of the transfer material and the toner image.

What is claimed is:

1. An image forming apparatus for use with a liquid developer and a transfer material having a surface, said image forming apparatus comprising:

an image carrier having a surface;

means for forming an electrostatic latent image on said surface of said image carrier;

developing means for supplying the liquid developer onto the electrostatic latent image to form a toner image on said surface of said image carrier, wherein said toner image has a charge and the charge has a polarity;

surplus removing means for removing a surplus of the liquid developer remaining on said surface of said image carrier downstream of said developing means;

a transfer means for transferring the toner image from said surface of said image carrier to the surface of the transfer material; and an electric charge applying means, disposed between said developing means and said surplus removing means, for applying an electric charge to the toner image upstream of the removal of the surplus of the liquid developer, wherein there is no removing means provided upstream of said electric charge applying means and the electric charge applied by said electric charge applying means has a polarity which is the same as the polarity of the charge of the toner image.

2. An image forming apparatus as claimed in claim 1, further comprising:

a further electric charge applying means, disposed between said surplus removing means and said transfer means, for applying an electric charge to the toner image only upstream of contact between the toner image and the surface of the transfer material, wherein the electric charge applied by said further electric charge applying means has a polarity which is the same as the polarity of the charge of the toner image.

3. An image forming apparatus as claimed in claim 2, wherein said transfer means comprises:

an upstream electric charge applying portion for applying an electric charge to the toner image through the transfer material, wherein the electric charge applied by said upstream electric charge applying portion has a polarity which is the same as the polarity of the charge of the toner image; and a downstream electric charge applying portion, positioned downstream of said upstream electric charge applying portion, for applying an electric charge to the toner image through the transfer material such that the toner image is transferred onto the surface of the transfer material, wherein the electric charge applied by said downstream electric charge applying portion has a polarity which is reverse of the polarity of the charge of the toner image.

4. An image forming apparatus as claimed in claim 1, wherein said transfer means comprises:

an upstream electric charge applying portion for applying an electric charge to the toner image through the transfer material, wherein the electric charge applied by said upstream electric charge applying portion has a polarity which is the same as the polarity of the charge of the toner image; and a downstream electric charge applying portion, positioned downstream of said upstream electric charge applying portion, for applying an electric charge to the toner image through the transfer material such that the toner image is transferred onto the surface of the transfer material, wherein the electric charge applied by said downstream electric charge applying portion has a polarity which is reverse of the polarity of the charge of the toner image.

5. An image forming method comprising:

forming an electrostatic latent image on a surface of an image carrier;

supplying a liquid developer onto the electrostatic latent image to form a toner image on the surface of the image carrier, wherein the toner image has a charge and the charge has a polarity;

applying an electric charge to the toner image before removing any surplus of the liquid developer, wherein the applied electric charge has a polarity which is the same as the polarity of the charge of the toner image;

removing a surplus of the liquid developer remaining on the surface of the image carrier; and transferring the toner image from the surface of the image carrier to a surface of a transfer material.

6. An image forming method as claimed in claim 5, further comprising:

applying a further electric charge to the toner image after said removing of a surplus of the liquid developer and before said transferring of the toner image, said applying of a further electric charge occurring only before contact between the toner image and the surface of the transfer material, wherein the further electric charge has a polarity which is the same as the polarity of the charge of the toner image.

7. An image forming method as claimed in claim 6, wherein said transferring of the toner image comprises:

applying an upstream electric charge to the toner image through the transfer material, wherein the upstream electric charge has a polarity which is the same as the polarity of the charge of the toner image; and applying a downstream electric charge to the toner image through the transfer material such that the toner image is transferred onto the transfer material, wherein the downstream electric charge has a polarity which is reverse of the polarity of the charge of the toner image.

8. An image forming method as claimed in claim 5, wherein said transferring of the toner image comprises:

applying an upstream electric charge to the toner image through the transfer material, wherein the upstream electric charge has a polarity which is the same as the polarity of the charge of the toner image; and applying a downstream electric charge to the toner image through the transfer material such that the toner image is transferred onto the transfer material, wherein the downstream electric charge has a polarity which is reverse of the polarity of the charge of the toner image.

9. An image forming apparatus for use with a liquid developer, said image forming apparatus comprising:

a transfer material having a surface;

an image carrier having a surface;

means for forming an electrostatic latent image on said surface of said image carrier;

developing means for supplying the liquid developer onto the electrostatic latent image to form a toner image on said surface of said image carrier, wherein said toner image has a charge and the charge has a polarity;

surplus removing means for removing a surplus of the liquid developer remaining on said surface of said image carrier downstream of said developing means;

a transfer means for transferring the toner image from said surface of said image carrier to said surface of said transfer material; and an electric charge applying means, disposed between said developing means and said surplus removing means, for applying an electric charge to the toner image upstream of the removal of the surplus of the liquid developer, wherein there is no removing means provided upstream of said electric charge applying means and the electric charge applied by said electric charge applying means has a polarity which is the same as the polarity of the charge of the toner image.

10. An image forming apparatus as claimed in claim 9, further comprising:

a further electric charge applying means, disposed between said surplus removing means and said transfer means, for applying an electric charge to the toner image only upstream of contact between the toner image and said surface of said transfer material, wherein the electric charge applied by said further electric charge applying means has a polarity which is the same as the polarity of the charge of the toner image.

11. An image forming apparatus as claimed in claim 10, wherein said transfer means comprises:

an upstream electric charge applying portion for applying an electric charge to the toner image through said transfer material, wherein the electric charge applied by said upstream electric charge applying portion has a polarity which is the same as the polarity of the charge of the toner image; and a downstream electric charge applying portion, positioned downstream of said upstream electric charge applying portion, for applying an electric charge to the toner image through said transfer material such that the toner image is transferred onto said surface of said transfer material, wherein the electric charge applied by said downstream electric charge applying portion has a polarity which is reverse of the polarity of the charge of the toner image.

12. An image forming apparatus as claimed in claim 9, wherein said transfer means comprises:

an upstream electric charge applying portion for applying an electric charge to the toner image through said transfer material, wherein the electric charge applied by said upstream electric charge applying portion has a polarity which is the same as the polarity of the charge of the toner image; and a downstream electric charge applying portion, positioned downstream of said upstream electric charge applying portion, for applying an electric charge to the toner image through said transfer material such that the toner image is transferred onto said surface of said transfer material, wherein the electric charge applied by said downstream electric charge applying portion has a polarity which is reverse of the polarity of the charge of the toner image.

13. An image forming apparatus for use with a liquid developer and a transfer material, said image forming apparatus comprising:

an image carrier operable to rotate in an image moving direction;

a liquid-developer supplying device, adjacent to said image carrier;

an electric charge applying device, adjacent to said image carrier, provided downstream of, and adjacent to, said liquid-developer supplying device in the image moving direction wherein there is no removing device provided upstream of said electric charge applying device;

a surplus-liquid-developer removing device, adjacent to said image carrier, provided downstream of, and adjacent to, said electric charge applying device in the image moving direction; and a transfer device provided downstream of said developing device in the image moving direction.

14. An image forming apparatus as claimed in claim 13, further comprising:

a contact area, at which said image carrier and the transfer material make contact with each other;

a further electric charge applying device, adjacent to said image carrier, provided downstream in the image moving direction of said surplus-liquid-developer removing device and provided upstream in the image moving direction of said transfer device and provided entirely upstream in the image moving direction of said contact area.

15. An image forming apparatus as claimed in claim 13, wherein said transfer device comprises:

an upstream electric charge applying portion; and a downstream electric charge applying portion, provided downstream of said upstream electric charge applying portion.

16. An image forming apparatus for use with a liquid developer, said image forming apparatus comprising:

a transfer material;

an image carrier operable to rotate in an image moving direction;

a liquid-developer supplying device, adjacent to said image carrier;

an electric charge applying device, adjacent to said image carrier, provided downstream of, and adjacent to, said liquid-developer supplying device in the image moving direction, wherein there is no removing device provided upstream of said electric charge applying device;

a surplus-liquid-developer removing device, adjacent to said image carrier, provided downstream of, and adjacent to, said electric charge applying device in the image moving direction;

a transfer device provided downstream of said developing device in the image moving direction; and a transfer material between said transfer device and said image carrier.

17. An image forming apparatus as claimed in claim 16, further comprising:

a contact area, at which said image carrier and said transfer material make contact with each other;

a further electric charge applying device, adjacent to said image carrier, provided downstream in the image moving direction of said surplus-liquid-developer removing device and provided upstream in the image moving direction of said transfer device and provided entirely upstream in the image moving direction of said contact area.

18. An image forming apparatus as claimed in claim 16, wherein said transfer device comprises:

an upstream electric charge applying portion; and a downstream electric charge applying portion, provided downstream of said upstream electric charge applying portion.

* * * * *